(12) United States Patent
Yamamoto et al.

(10) Patent No.: US 7,186,481 B2
(45) Date of Patent: Mar. 6, 2007

(54) FLARE MEASURING MASK AND FLARE MEASURING METHOD OF SEMICONDUCTOR ALIGNER

(75) Inventors: Yasuhiro Yamamoto, Miyagi (JP); Akira Watanabe, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 569 days.

(21) Appl. No.: 10/761,215

(22) Filed: Jan. 22, 2004

(65) Prior Publication Data

US 2005/0095510 A1     May 5, 2005

(30) Foreign Application Priority Data

Oct. 31, 2003   (JP)   ............... 2003/371747

(51) Int. Cl.
*G03F 9/00*  (2006.01)
(52) U.S. Cl. ............................... 430/5; 430/30
(58) Field of Classification Search ............ 430/5, 430/30
See application file for complete search history.

(56) References Cited

U.S. PATENT DOCUMENTS 6,233,056 B1 *  5/2001  Naulleau et al. ............ 356/520
6,835,507 B2 * 12/2004  Ki et al. ........................ 430/5
2003/0068565 A1  4/2003  Ki et al.
2004/0021854 A1*  2/2004  Hikima ........................ 356/229

FOREIGN PATENT DOCUMENTS

| JP | 2001-222097 | 8/2001 |
| JP | 2001-296646 | 10/2001 |
| JP | 2003-100624 | 4/2003 |

* cited by examiner

*Primary Examiner*—Christopher G. Young
(74) *Attorney, Agent, or Firm*—Volentine & Whitt, P.L.L.C.

(57) ABSTRACT

A flare measuring mask and a flare measuring method are capable of measuring flare at high sensitivity by an optical measuring instrument. The first measuring portion has a double cross shielding area including first stripe-shaped shielding portions of the same figure aligned in parallel at regular intervals and third stripe-shaped shielding portions of the same figure aligned in parallel at regular intervals, crossing with the first shielding portions at right angles, and the second measuring portion includes second-stripe shaped shielding portions identical to the first shielding portions of the first measuring portion and fourth stripe-shaped shielding portions identical to the third shielding portions, crossing with the second shielding portions at right angles in a central portion. In the resist length measuring process, the presence of the flare is checked by measuring the length of the resist pattern corresponding to the respective shielding portions in the longitudinal direction.

14 Claims, 11 Drawing Sheets

FIG. 9A
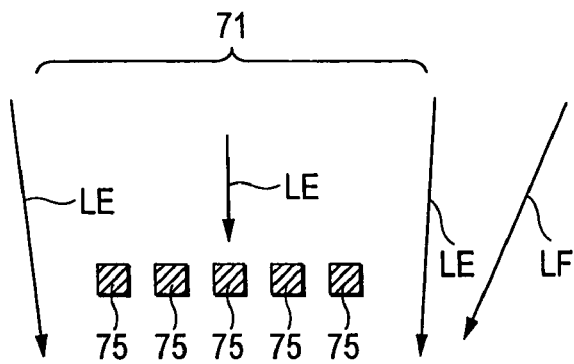
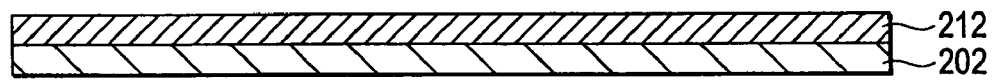
FIG. 9B
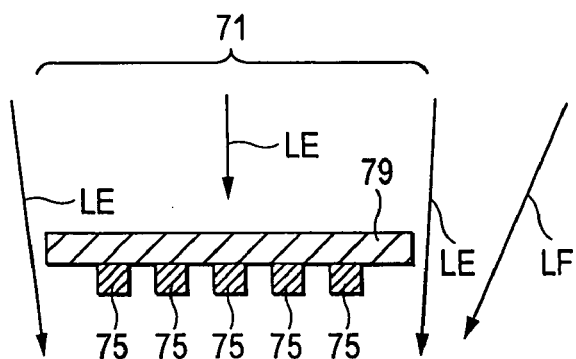
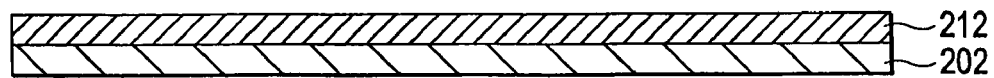

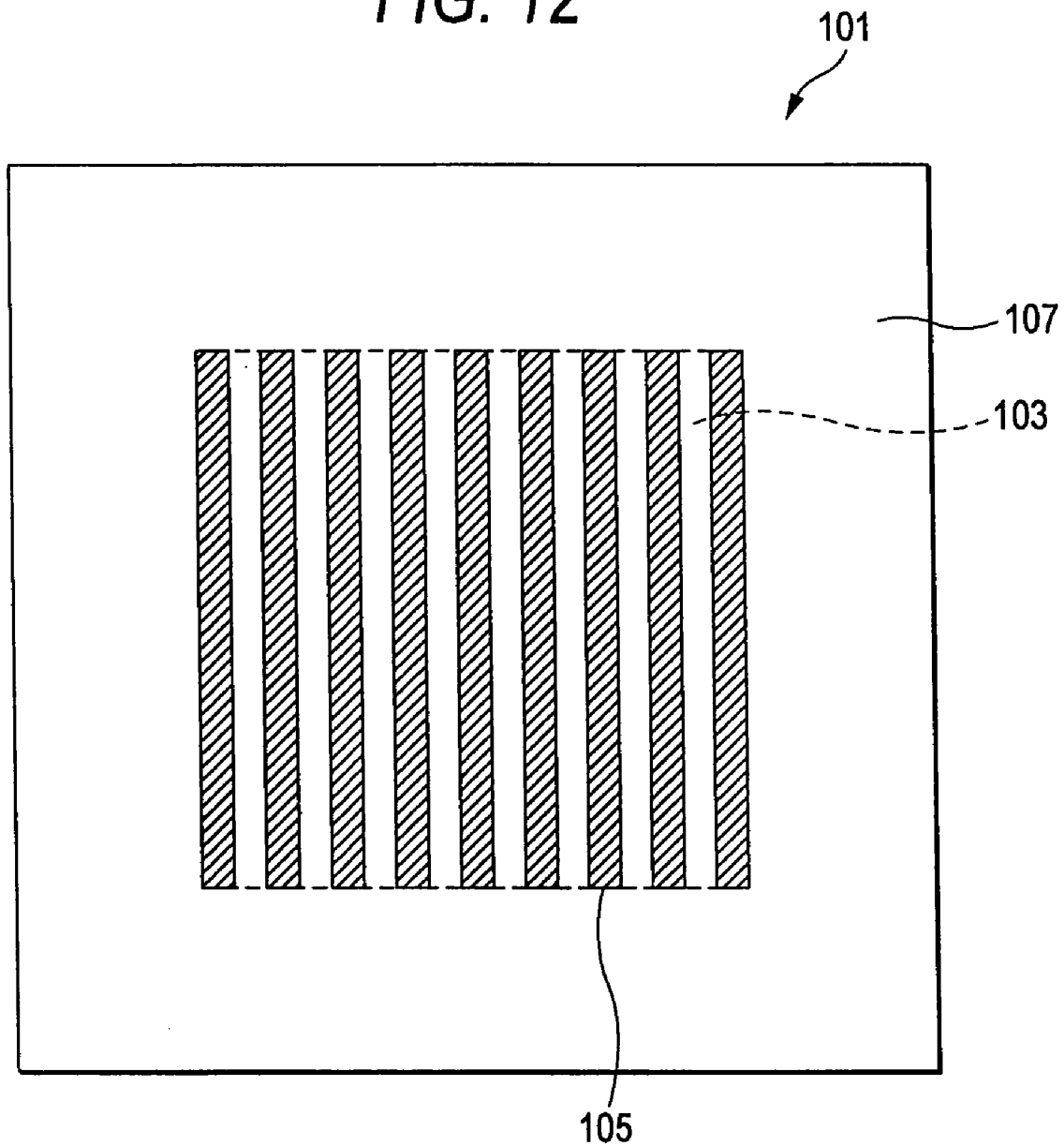

FLARE MEASURING MASK AND FLARE MEASURING METHOD OF SEMICONDUCTOR ALIGNER

BACKGROUND OF THE INVENTION

1. Field of the Invention

The present invention relates to a flare measuring mask and a flare measuring method of a semiconductor aligner.

2. Description of the Related Art

A semiconductor device is manufactured by repeating an exposure process of copying a circuit pattern formed on a mask as a mask pattern, on a semiconductor substrate by using an aligner. When there is an aberration on a lens for use in copying, there is a fear of deforming the circuit pattern while repeating the exposure process. Then, in the exposure process, a lens aberration of the aligner is measured so as to accurately form the pattern to be copied (for example, refer to Patent Article 1 or Patent Article 2).

In order to measure the lens aberration, various measurements are performed depending on the characteristic component of the lens aberration. A factor of causing the lens aberration is the flare component. Flare is a light which overlaps the original optical image and expands therefrom, reflected or diffused on a lens surface or a mask surface and flowing into the pattern to form. There is a lot of flare in a bright portion having a rough mask pattern and a little in a dark portion having a fine mask pattern.

Then, a shielding portion is provided around a measuring portion and flare is measured by varying a distance between the measuring portion and the shielding portion.

With reference to FIG. 11, the conventional flare measuring method will be described. FIGS. 11A and 11B are views for use in describing a flare measuring mask for use in the conventional flare measurement. FIG. 11A shows an example of a first measurement mask pattern as the measurement mask pattern of the flare measuring mask. The first measurement mask pattern 81 includes a first rectangular transparent area 87 formed by a first shielding area 89 and a first measuring portion 83 similar to the first transparent area 87 and inside of the first transparent area 87. The first measuring portion 83 includes a plurality of first stripe-shaped shielding portions 85 of the same figure aligned in parallel at regular intervals.

FIG. 11B shows an example of a second measurement mask pattern 91 that is the measurement mask pattern of the flare measuring mask. The second measurement mask pattern 91 includes a second rectangular transparent area 97 formed by a second shielding area 99 and a second measuring portion 93 similar to the second transparent area 97 and inside of the second transparent area 97.

The second measuring portion 93 includes a plurality of second stripe-shaped shielding portions 95 of the same figure aligned in parallel at regular intervals. The second measuring portion 93 has the same figure and the same size as the first measuring portion 83. Namely, the second stripe-shaped shielding portion 95 has the same line width, the same intervals, and the same number of lines as the first stripe-shaped shielding portion 85.

The first shielding area 89 is different from the second shielding area 99 in size and the first transparent area 87 formed by the first shielding area 89 is also different from the second transparent area 97 formed by the second shielding area 99 in size. Since the first measuring portion 83 and the second measuring portion 93 has the same figure and the same size, the width of an opening P1 of the first transparent area 87, namely a distance between the first measuring portion 83 and the first shielding area 89 is different from the width of an opening P2 of the second transparent area 97, namely a distance between the second measuring portion 93 and the second shielding area 99.

The first measurement mask pattern 81 is used to do patterning on a wafer through exposure of the photoresist provided on the wafer, hence to get a resist pattern. When the exposure is affected by the flare, the reflected and diffused light is irradiated on the photoresist. Therefore, the stripe-shaped pattern formed as the resist pattern becomes narrower in width and shorter in length than the pattern in the case of having no flare.

Consequently, with the same aligner, the second measurement mask pattern 91 having the opening width different from that of the first measurement mask pattern 81 is used to do the above-mentioned process of exposure and patterning. According as the opening portion becomes larger, it is much more, affected by the flare, exposure is performed and the line width of a resist pattern is measured with the flare measurement mask patterns of different opening widths P1 and P2, hence to obtain the influence of the flare (for example, refer to Patent Article 3).

There is also a flare measuring method with double exposure. FIG. 12 shows a measurement mask pattern 101 for double exposure, for use in the flare measurement through double exposure. This mask pattern 101 has a first measuring portion 103 including first stripe-shaped shielding portions 105 and a first transparent area 107. The measurement mask pattern 101 for double exposure is different from the above-mentioned first measurement mask pattern 81 and second measurement mask pattern 91 in that the pattern 101 doesn't have the first and the second shielding areas. The measuring portion 103 of the measurement mask pattern 101 for double exposure has the same structure as the first measuring portion 83 and the second measuring portion 93.

At first, two measurement mask patterns 101 for double exposure are prepared, and exposure is performed with these two measurement mask patterns 101 for double exposure. Next, a shielding pattern capable of covering the measurement mask pattern 101 for double exposure covers the measurement mask pattern 101 for double exposure, and then exposure is performed there. The exposures with the shielding patterns of different size (109a and 109b in FIG. 13) substantially have the same results as the exposures with the patterns of different opening widths P1 and P2 described with reference to FIG. 11, hence to obtain the influence of the flare. Here, FIGS. 13A and 13B are views for use in describing the double exposure shielding patterns.

[Patent Article 1] JP-A-2001-222097 (claims 1 to 3)
[Patent Article 2] JP-A-2001-296646 (claim 1)
[Patent Article 3] JP-A-2003-100624 (paragraph 49 to 50, FIG. 7)

The above conventional flare measuring method, however, has such a problem that the sensitivity is dull and the influence of the flare is difficult to measure in this case of measuring the influence thereof according to a change in the width of a line forming a stripe-shaped mask pattern. The width of the line in the measurement mask pattern is several dozen to several hundred nm and in order to measure the width of the line, it is necessary to use a critical dimension-scanning electron microscope (CD-SEM).

For example, in order to measure the influence of the flare in the orthogonal two directions, it is necessary to do the exposure process in another process.

In consideration of the above problems, an object of the invention is to provide a flare measuring mask and a flare measuring method capable of measuring the flare with an optical measuring instrument at higher sensibility.

SUMMARY OF THE INVENTION

In order to achieve the above object, the flare measuring method for checking the presence of the flare of a semiconductor aligner according to the invention includes the following processes.

In the patterning process, the first measurement mask pattern and the second measurement mask pattern are prepared, the first and second measurement mask patterns are projected on a resist layer in a reduced size through light exposure, and then the exposed resist layer is patterned.

The first measurement mask pattern includes a first transparent area and a first measuring portion. The first transparent area is a rectangular area formed on a first shielding area. The first measuring portion similar to the first transparent area, provided within the first transparent area, includes a plurality of first stripe-shaped shielding portions of the same figure aligned in parallel at regular intervals.

The second measurement mask pattern includes a second transparent area and a second measuring portion. The second transparent area is an area similar to the first transparent area and wider than this, which is formed by a second shielding area. The second measuring portion includes a plurality of second stripe-shaped shielding portions identical to the first stripe-shaped shielding portions, which are provided within the second transparent area.

Following the patterning process, the resist length measuring process is performed. The first resist pattern length of the first resist pattern in the direction orthogonal to the alignment direction, corresponding to the first stripe-shaped shielding portions and the second resist pattern length of the second resist pattern in the direction orthogonal to the alignment direction, corresponding to the second stripe-shaped shielding portions, obtained in the patterning process, are optically measured.

Continuously, the presence of the first flare is checked in the flare measuring process. The presence of the first flare is checked according to the first opening width P1 that is a space between the first shielding area and the first measuring portion, the second opening width P2 that is a space between the second shielding area and the second measuring portion, the first resist pattern length L1, and the second resist pattern length L2.

In order to realize the above-mentioned flare measuring method, it is preferable that the first measuring portion has a double cross shielding portions consisting of a plurality of first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles and that the second measuring portion includes the second stripe-shaped shielding portions identical to the first stripe-shaped shielding portions of the first measuring portion and the fourth stripe-shaped shielding portions identical to the third stripe-shaped shielding portions of the first measuring portion, crossing with the second stripe-shaped shielding portion at right angles in a central portion.

In the resist length measuring process, further, the third resist pattern length L3 of the third resist pattern in the longitudinal direction, corresponding to the third stripe-shaped shielding portions and the fourth resist pattern length L4 of the fourth resist pattern in the longitudinal direction, corresponding to the fourth stripe-shaped shielding portions, obtained in the patterning process, are optically measured.

In the flare-measuring process, further, the presence of the second flare in a direction different from the first flare is checked according to the first opening width P1, the second opening width P2, the third resist pattern length L3, and the fourth resist pattern length L4.

According to the preferred embodiment of the invention, it is preferable that the first stripes-shaped shielding portions are different from the third stripe-shaped shielding portions in line width and line intervals, the first strips-shaped shielding portions are identical to the second stripe-shaped shielding portions in line width and line intervals, and that the third stripe-shaped shielding portions are identical to the fourth stripe-shaped shielding portions in line width and line intervals.

In order to achieve the above object, the flare measuring method for checking the presence of the flare in a semiconductor aligner of the invention comprises the following processes.

In the patterning process, at first, the first measurement mask pattern and the second measurement mask pattern are prepared and the first and the second measurement mask patterns are projected on a resist layer in a reduced size through light exposure.

The first measurement mask pattern includes a first transparent area and a first measurement portion. The first measuring portion includes a plurality of first stripe-shaped shielding portions of the same figure aligned in parallel at regular intervals, within the first transparent area.

The second measurement mask pattern includes a second transparent area and a second measuring portion. The second measuring portion includes second stripe-shaped shielding portions identical to the first stripe-shaped shielding portions within the second transparent area.

Next, a first shielding and a second shielding patterns different from each other in area, similar to the first and the second measurement mask patterns with the same area or the larger area than the first and the second measurement mask patterns, are prepared. The first measurement mask pattern is covered with the first shielding pattern and the second measurement mask pattern is covered with the second shielding pattern, and after projecting the above on a resist layer in a reduced size through light exposure, patterning is performed on the exposed resist layer.

Following the patterning process, the resist length measuring process is performed. The first resist pattern length of the first resist pattern in the direction orthogonal to the alignment direction, corresponding to the first stripe-shaped shielding portions and the second resist pattern length of the second resist pattern in the direction orthogonal to the alignment direction, corresponding to the second stripe-shaped shielding portions, obtained in the patterning process, are optically measured.

Continuously, the presence of the first flare is checked in the flare measuring process. The presence of the first flare is checked according to the first shielding width S1 that is a space between the first shielding pattern and the first measuring portion, the second shielding width S2 that is a space between the second shielding pattern and the second measuring portion, the first resist pattern length L1, and the second resist pattern length L2.

In order to realize the above-mentioned flare measuring method, it is preferable that the first measuring portion has a double cross shielding portions consisting of a plurality of first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles and that the second measuring portion includes the second stripe-shaped shielding portions identical to the first stripe-shaped shielding portions of the first measuring portion and the fourth stripe-shaped shielding portions identical to the third stripe-shaped shielding portions of the first measuring portion, crossing with the second stripe-shaped shielding portion at right angles in a central portion.

In the resist length measuring process, further, the third resist pattern length of the third resist pattern in the longitudinal direction, corresponding to the third stripe-shaped shielding portions and the fourth resist pattern length of the fourth resist pattern in the longitudinal direction, corresponding to the fourth stripe-shaped shielding portions, obtained in the patterning process, are optically measured.

In the flare measuring process, further, the presence of the second flare in a direction different from the first flare is checked according to the first shielding width S1 that is a space between the first shielding pattern and the first measuring portion, the second shielding width S2 that is a space between the second shielding pattern and the second measuring portion, the third resist pattern length L3, and the fourth resist pattern length L4.

According to the preferred embodiment of the invention, it is preferable that the first stripes-shaped shielding portions are different from the third stripe-shaped shielding portions in line width and line intervals, the first strips-shaped shielding portions are identical to the second stripe-shaped shielding portions in line width and line intervals, and that the third stripe-shaped shielding portions are identical to the fourth stripe-shaped shielding portions in line width and line intervals.

In order to achieve the above object, the flare measuring mask of the invention has double cross shielding portions including a plurality of first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles in a central portion, within the transparent area.

According to a preferred embodiment of the flare measuring mask of the invention, it is preferable that the first stripe-shaped shielding portions are different from the third stripe-shaped shielding portions in line width and line intervals.

According to another preferred embodiment of the flare measuring mask of the invention, it is preferable that the transparent area is formed by a shielding area.

Further, according to the flare measuring mask of the invention, it is preferable that a shielding mask is formed within the central lattice area of the double cross shielding portions.

According to the flare measuring method of the invention, since the length of the resist pattern whose length is some dozen µm and whose width is several hundred nm is measured, it is not necessary to use the CD-SEM usually used in the measurement of the width, but it can be measured by the ordinary optical measuring instrument. Since the resist pattern can be measured in the longitudinal direction, the measurement can be performed at higher sensitivity than the measurement in the width direction.

Since the measurement mask pattern is formed by the double cross shielding portions including a plurality of first striped-shaped shielding portions of the same figure aligned in parallel at regular intervals and a plurality of third stripe-shaped shielding portions of the same figure aligned in parallel at regular intervals, crossing with the first stripe-shaped shielding portions at right angles, it is possible to check the presence of the first flare and the second flare, namely the flares in two orthogonal directions, in one measurement.

Since the orthogonal stripe-shaped shielding portions are different from each other in line width and line intervals, it is possible to check the presence of the flare on the different mask patterns in one measurement.

According to the flare measuring method of the invention, since the exposure is performed twice, it is possible to check the influence of the flare, especially incident from the outside of the measurement mask pattern. In this case, it is necessary to prepare only one kind of the measurement mask pattern and the shielding patterns of different size. Further, since the resist pattern is measured in the longitudinal direction, it is not necessary to use the CD-SEM, but the ordinary optical measuring instrument can measure it. Further, since the resist pattern is measured in the longitudinal direction, the measurement can be performed at higher sensitivity than the measurement in the width direction.

Further, since the measurement mask pattern is formed by the double cross shielding portions including a plurality of first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles, it is possible to check the presence of the first flare and the second flare, namely the orthogonal flares in the two directions in one measurement.

Further, by making the orthogonal stripe-shaped shielding portions different from each other in line width and line intervals, it is possible to check the presence of the flare on the different mask patterns in one measurement.

According to the exposure by using the flare measuring mask of the invention, it is possible to measure the influence of the first flare and the second flare, namely the orthogonal flares in the two directions at once.

Since the first stripe-shaped shielding portions and the third stripe-shaped shielding portions are different from each other in line width and line intervals, according to the exposure by using the flare measuring mask of the invention and further according to the exposure by using the shielding patterns of different size, it is possible to estimate the flare on the different mask patterns in one measurement.

According to the flare measuring mask of the invention, by changing the size of the transparent area formed by the shielding area, the opening width is changed and therefore, it is possible to examine the presence of the flare and its degree.

By forming the central portion of the double cross in a rectangular shape not a lattice, it is possible to manufacture the flare measuring mask more easily.

BRIEF DESCRIPTION OF THE DRAWINGS

FIG. 9 is a schematic view for use in describing a method for measuring the flare in double exposure according to the second embodiment.

FIG. 12 is a view for use in describing the conventional measurement mask pattern for use in measuring the flare in double exposure.

DETAILED DESCRIPTION OF THE INVENTION

Though embodiments of the invention will be hereinafter described, referring to FIG. 1, the components and the arrangement thereof are to be schematically shown only for the shake of easy understanding of the invention. Though the invention will be described according to preferred structural examples thereof, the composition (material) of each component and the numeric condition is described as only a preferred example. Accordingly, the invention is not restricted to the following embodiments.

First Embodiment

Figure 1A:
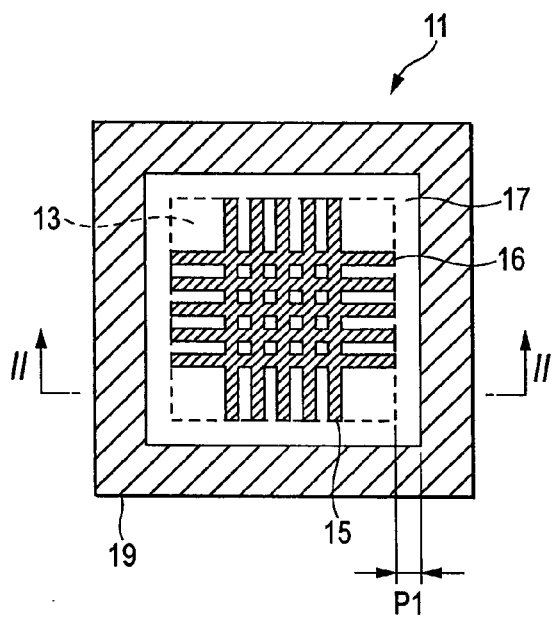
FIG. 1 is a view for use in describing a measuring pattern of a flare measuring mask according to a first embodiment.
Figure 1B:
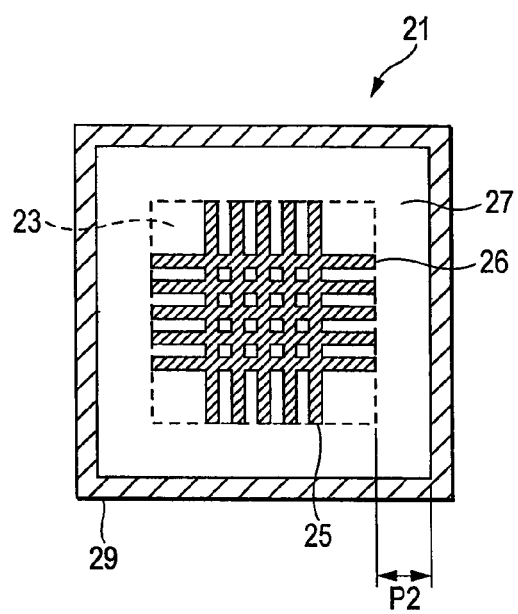

With reference to the drawings, a flare measuring mask and a flare measuring method of the invention will be described. FIGS. 1A and 1B are schematic views for use in describing the flare measuring mask of the invention. FIG. 1A shows a first measurement mask pattern 11 as one example of the measurement mask pattern of the flare measuring mask. The first measurement mask pattern 11 includes a first rectangular transparent area 17 formed by a first shielding area 19 and a first measuring portion 13 similar to the first transparent area 17 and inside of the first transparent area 17.

The first measuring portion 13 includes a plurality of first stripe shaped-shielding portions 15 of the same figure aligned in parallel at regular intervals and a plurality of third stripe shaped-shielding portions 16 of the same figure aligned in parallel at regular intervals. The first stripe-shaped shielding portions 15 and the third stripe-shaped shielding portions 16 are arranged in a double cross, crossing each other at right angles in a central portion. Hereafter, the stripe-shaped shielding portion may be referred to as a stripe simply.

FIG. 1B shows a second measurement mask pattern 21 as one example of the measurement mask pattern of the flare measuring mask. The second measurement mask pattern 21 includes a second rectangular transparent area 27 formed by a second shielding area 29 and a second measuring portion 23 similar to the second transparent area 27 and inside of the second transparent area 27. The following description will be made in the case where the first transparent area 17 and the second transparent area 27 are squares. Although the first shielding area 19 and the second shielding area 29 are shown in a shape of Japanese character 口, the first and the second shielding areas 19 and 29 may be extended outward as far as they are so large that the first and second transparent areas 17 and 27 can be prevented from receiving the influence of the flare from the outside of the first and second shielding areas 19 and 29.

The second measuring portion 23 includes a plurality of second stripes 25 of the same figure aligned in parallel at regular intervals and a plurality of fourth stripes 26 of the same figure aligned in parallel at regular intervals, and the second stripes 25 and the fourth stripes 26 are arranged in a double cross, crossing each other at right angles in a central portion. The second measuring portion 23 has the same figure and the same size as the first measuring portion 13. Namely, the second stripes 25 have the same figure as the first stripes 15, with the same line width, the same intervals, and the same number of stripes, and the fourth stripes 26 have the same figure as the third stripes 16, with the same line width and length, the same intervals, and the same number of stripes.

The first transparent area 17 formed by the first shielding area 19 has to be different from the second transparent area 27 formed by the second shielding area 29 in size, and in this embodiment, the second transparent area 27 is formed larger than the first transparent area 17.

Figure 2:
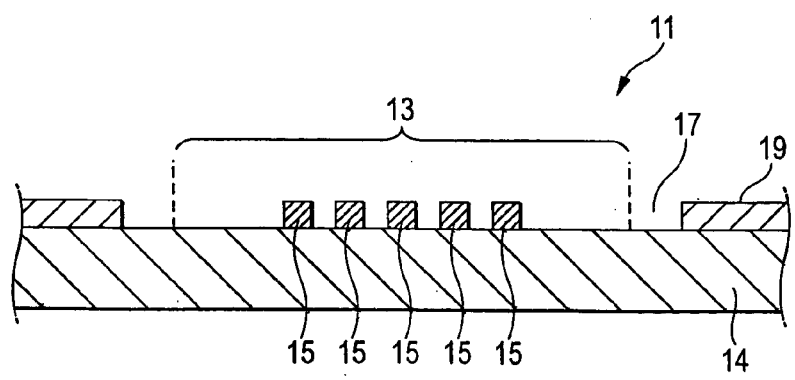
FIG. 2 is a view for use in describing the flare measuring mask according to the first embodiment.

With reference to FIG. 1A and FIG. 2, the outline of the structure of the flare measuring mask having the above-mentioned measurement mask pattern will be described. FIG. 2 is a cross sectional view taken on the line II—II of FIG. 1A. The flare measuring mask is formed by providing an optical shielding material such as chrome on the transparent substrate 14 such as quartz. The first stripes 15, the third stripes 16, and the first shielding area 19 are formed by the optical shielding material. The first transparent area 17, the areas between the first stripes 15 of the first measurement mask pattern 11, and the areas between the third stripes 16 of the first measurement mask pattern 11 are the opening areas of the optical shielding material.

Since the structure of the second measurement mask pattern is the same as that of the first measurement mask pattern, the description thereof is omitted. The first measurement mask pattern 11 and the second measurement mask pattern may be provided on the same transparent substrate 14, or the second measurement mask pattern may be formed on another transparent substrate than the transparent substrate 14 having the first measurement mask pattern 11.

Figure 3A:
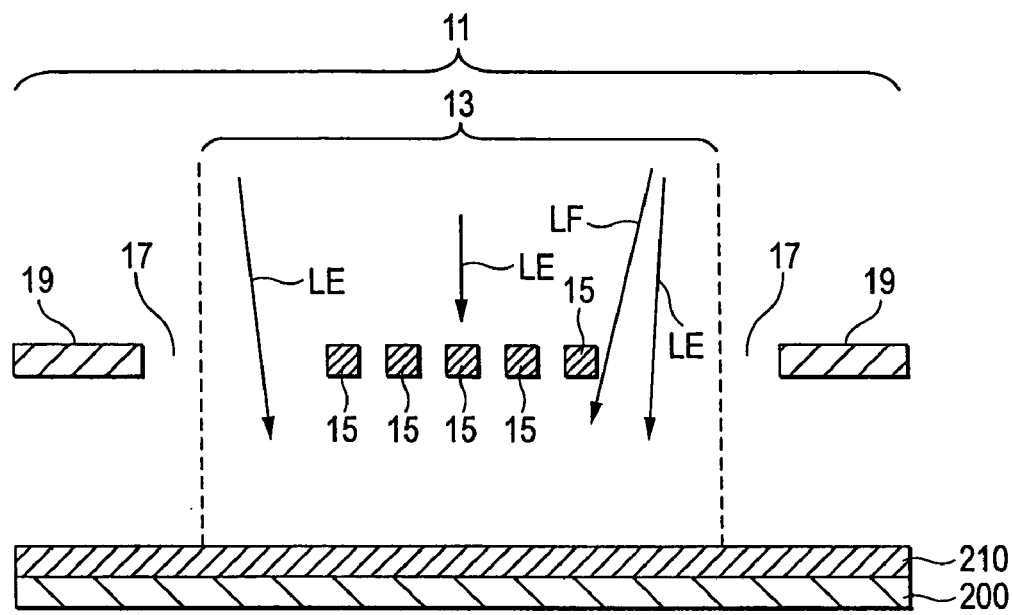
FIG. 3 is a view for use in describing the flare measuring method according to the first embodiment.
Figure 3B:
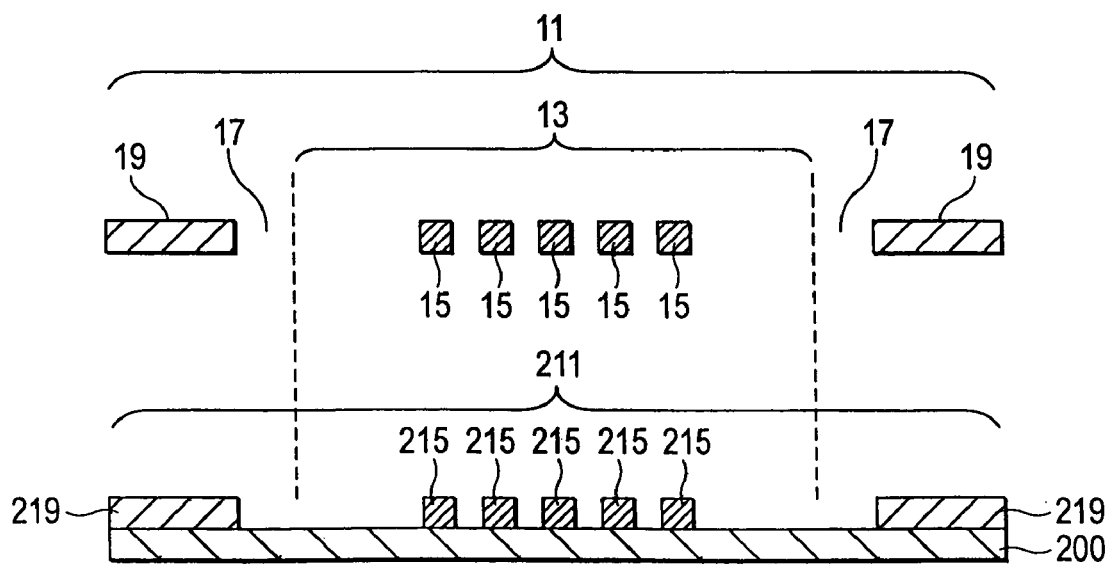

With reference to FIG. 1A and FIGS. 3A and 3B, the flare measuring method according to the first embodiment will be described.

FIGS. 3A and 3B are views for use in describing the flare measuring method. FIGS. 3A and 3B are schematic views corresponding to a cross section in the line II—II of FIG. 1A (the transparent substrate is not illustrated in FIG. 3). A wafer 200 with a resist layer 210 formed on its surface by photoresist is fixed on a semiconductor device (not illustrated) that is a target of the flare measurement is exposed to light with the first measurement mask pattern 11 (refer to FIG. 3A). In this figure, an exposure light is indicated by $L_E$ and the flare is indicated by $L_F$.

The first measurement mask pattern 11 is projected on the resist layer 210 in a reduced size through the exposure. By patterning the resist layer 210 having been exposed in the patterning process, the first resist pattern 211 is formed on the wafer 200. The first resist pattern 211 includes first resist stripes 215 corresponding to the first stripes 15, third resist stripes (not illustrated) corresponding to the third stripes (not illustrated), and the resist remaining portion 219 corresponding to the first shielding area 19 (refer to FIG. 3B).

By performing the exposure and the patterning on the second measurement mask pattern 21 under the same condition as mentioned with reference to FIGS. 3A and 3B, the second resist pattern is formed on the wafer. The second resist pattern includes the second resist stripes corresponding to the second stripes, the fourth resist stripes corresponding to the fourth stripes, and the resist remaining portion corresponding to the second shielding area.

Figure 4A:
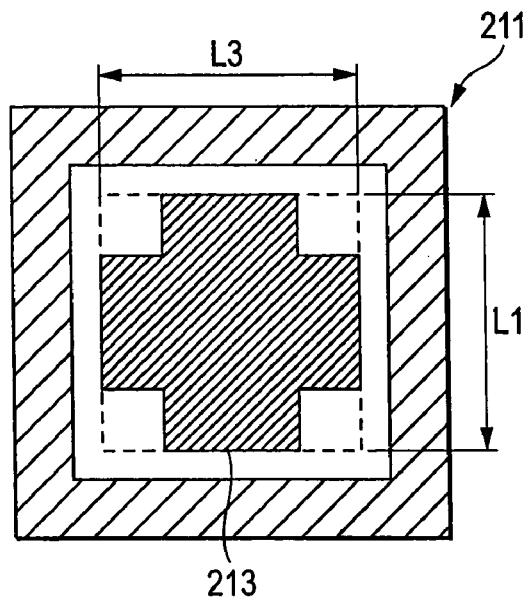
FIG. 4 is a view for use in describing a resist pattern according to the first embodiment.
Figure 4B:
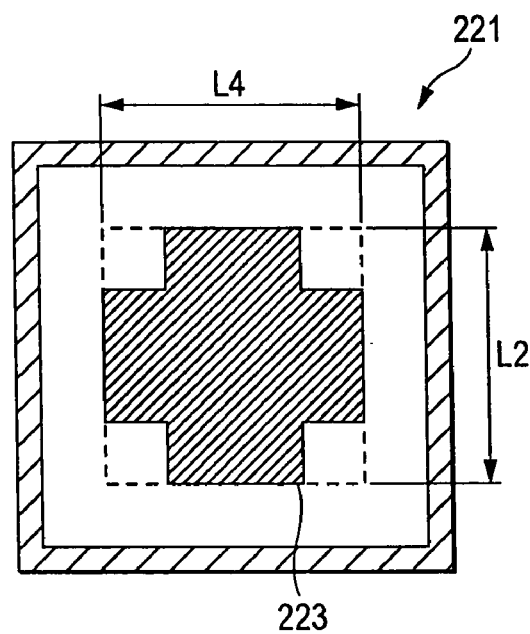

Continued from the patterning process, a process of measuring a resist length is performed. The measuring process of the resist length will be described with reference to FIGS. 1A and 1B and FIGS. 4A and 4B. FIGS. 4A and 4B are views for use in describing the measuring process of the resist length according to the first embodiment. The first resist pattern 211 corresponding to the first measurement mask pattern 11 and the second resist pattern 221 corresponding to the second measurement mask pattern 21 obtained by the patterning process are measured by an optical measuring instrument. The first resist measuring portion 213 and the second resist measuring portion 223 originally in a shape of pound sign are observed like a cross by the optical measuring instrument as a result of the intervals between the grids filled and charged. FIGS. 4A and 4B show the resist patterns in a shape of cross as observed.

The optical measuring instrument is used to measure the length L1 of the first resist stripes (hereafter, also referred to as the first resist stripe length) in the longitudinal direction and the length L3 of the third resist stripes (hereafter, also referred to as the third resist stripe length) in the longitudinal direction, as for the first resist pattern 211 and the length L2 of the second resist stripes (hereafter, also referred to as the second resist stripe length) in the longitudinal direction and the length L4 of the fourth resist stripes (hereafter, also referred to as the fourth resist stripe length) in the longitudinal direction, as for the second resist pattern 221.

Figure 5:
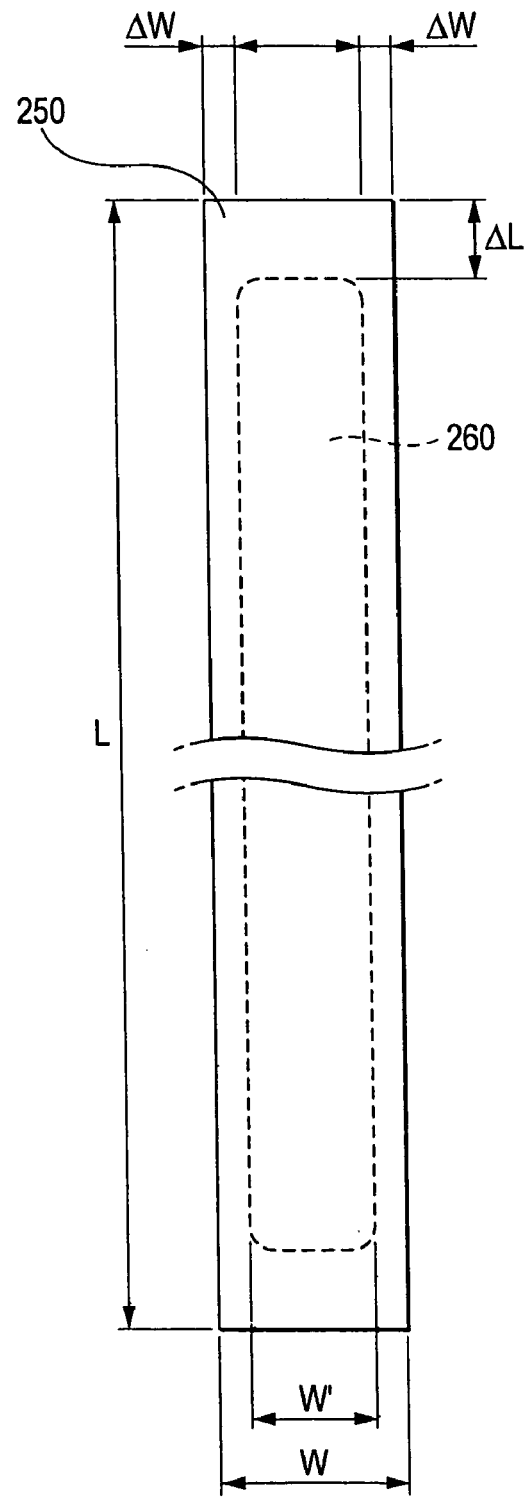
FIG. 5 is a view for use in describing the influence of flare.

Continuously, the presence of the flare is checked in the flare measuring process. Referring to FIG. 5, the influence of the flare will be described. The flare is a light which overlaps the original optical image and expands therefrom, reflected or diffused on a lens surface or a mask surface and flowing into a pattern to form. Therefore, a linear resist pattern 260 formed corresponding to the linear pattern becomes narrower in width by $\Delta W \times 2$ and shorter in length by $\Delta L \times 2$ than the linear resist pattern 250 to be formed originally.

When there exists a flare, there is a lot of flare in a bright portion having a rough mask pattern and a little in a dark portion having a fine mask pattern. Therefore, when a mask having various opening portions is used, the presence of a flare and its degree can be checked by measuring the length or the width of the formed linear resist pattern.

For example, when using a linear pattern of which the width is some dozens to several hundred nm and the length is some dozens μm, the CD-SEM has to be used in order to measure the width of the resist pattern, but in order to measure the length, an ordinal optical measuring instrument such as an optical microscope can be used. The optical measuring instrument can measure the above more easily for a shorter period than the CD-SEM.

Since the end portion of the stripe-shaped pattern is more easily affected by the flare than the central portion, a change in length becomes greater than a change in width. Therefore, it is possible to measure the flare with higher sensitivity in the longitudinal direction. In the case of using the optical measuring instrument, as mentioned referring to FIGS. 4A and 4B, since the pound sign-shaped pattern is found like the cross pattern, it is possible to measure the flare after compensating for variation of the respective linear traces.

When there is no first flare, the first resist stripe length L1 is equal to the second resist stripe length L2 of the resist stripes because the first stripes 15 and the second stripes 25 have the same figure. When there is a first flare, however, in the case of setting larger the second opening width P2 that is the space between the second shielding area 29 and the second measuring portion 23 than the first opening width P1 that is the space between the first shielding area 19 and the first measuring portion 13, the second resist pattern 221 is much more affected by the first flare and the second resist stripe length L2 becomes shorter than the first resist stripe length L1.

Accordingly, when the first resist pattern length L1 is equal to the second resist pattern length L2, it is found that the first flare does not exist, and when the second resist pattern length L2 is shorter than the first resist pattern length L1, it is found that there exists some flare. Also, when there is a difference between the first resist pattern length L1 and the second resist pattern length L2, it is found that the first flare is greater according as the difference is larger and the first flare is smaller according as the difference is smaller.

Although the description has been made in the case of using two kinds of measurement mask patterns, use of three kinds of measurement mask patterns and the more could examine the presence of flare and its degree more accurately.

As for the direction of crossing with the first resist pattern and the second resist pattern, similarly, the presence of the second flare and its degree in the direction of crossing with the first flare at right angles is checked according to the first opening width P1, the second opening width P2, the third resist pattern length L3, and the fourth resist pattern length L4.

It is preferable that the first and the second opening widths P1 and P2 are set within the range of some to several hundred μm in consideration of the length of each stripe.

According to the flare measuring mask and the flare measuring method of the first embodiment, it is possible to measure the flare more easily for a shorter time, and simultaneously, to measure the first and the second flare, namely, the flare in the two directions of crossing each other at right angles.

Variation 1 of the First Embodiment

Figure 6A:
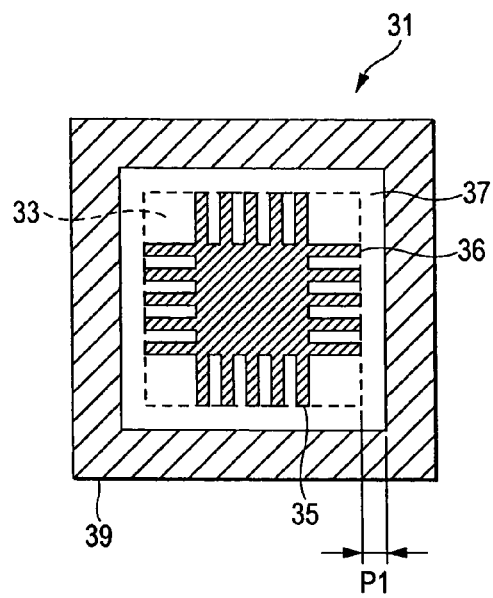
FIG. 6 is a view for use in describing another variation 1 of the measurement mask pattern according to the first embodiment.
Figure 6B:
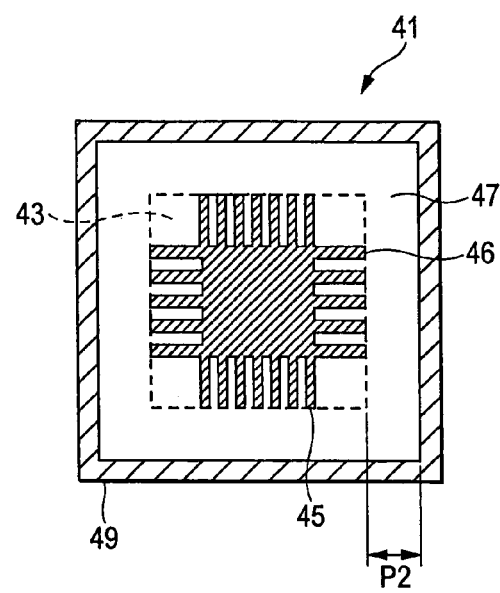

FIGS. 6A and 6B are views for use in describing a variation 1 of the measurement mask pattern of the first embodiment. FIG. 6A shows a first measurement mask pattern 31 as the measurement mask pattern of a flare measuring mask. The first measurement mask pattern 31 includes a first rectangular transparent area 37 formed by a first shielding area 39 and a first measuring portion 33 similar to the first transparent area 37 and inside of the first transparent area 37.

The first measuring portion 33 includes a plurality of first stripes 35 of the same figure aligned in parallel at regular intervals and a plurality of third stripes 36 of the same figure aligned in parallel at regular intervals. The first stripes 35 and the third stripes 36 are arranged in a double cross, crossing each other at right angles in a central portion, but the central portion of the double cross structure becomes a rectangular shielding portion.

FIG. 6B shows a second measurement mask pattern 41 as an example of the measurement mask pattern of a flare measuring mask. The second measurement mask pattern 41 includes a second rectangular transparent area 47 formed by a second shielding area 49 and a second measuring portion 43 similar to the second transparent area 47 and inside of the second transparent area 47.

The second measuring portion 43 includes a plurality of second stripes 45 of the same figure aligned in parallel at regular intervals and a plurality of fourth stripes 46 of the same figure aligned in parallel at regular intervals, and the second stripes 45 and the fourth stripes 46 are arranged in a double cross, crossing each other at right angles in a central portion, but the central portion of the double cross structure becomes a rectangular shielding portion. The second measuring portion 43 has the same shape and the same size as the first measuring portion 33. Namely, the second stripes 45 have the same figure as the first stripes 35, with the same line width, the same intervals, and the same number of lines, and the fourth stripes 46 have the same figure as the third stripes 36, with the same width and length, the same intervals, and the same number of lines. Here shows the example with the first and the second measuring portions 33 and 43 and the shielding portions around the central portion formed in square.

The first shielding area 39 is different from the second shielding area 49 in size and the first transparent area 37 formed by the first shielding area 39 is also different from the second transparent area 47 formed by the second shielding area 49 in size.

The measurement mask pattern of the variation 1 is different from the measurement mask pattern of the first embodiment described referring to FIGS. 1A and 1B in that the central portions of the double cross of the first measuring portion 33 and the second measuring portion 43 are formed by the shielding materials. Since the portion that has been lattice in the first embodiment turns to be rectangular, the manufacture of the measurement mask pattern becomes easier.

Variation 2 of the First Embodiment

Figure 7A:
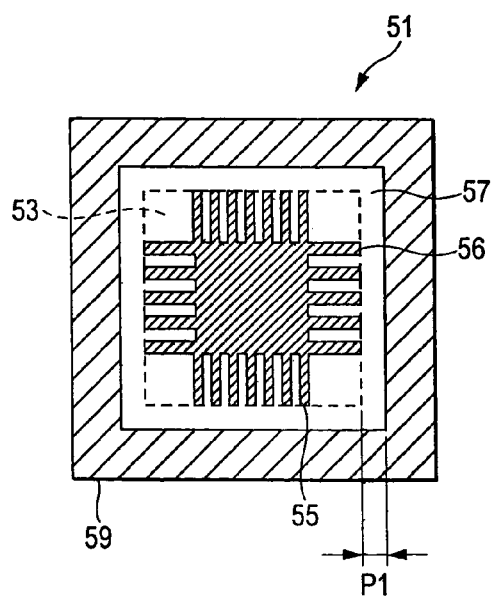
FIG. 7 is a view for use in describing another variation 2 of the measurement mask pattern according to the first embodiment.
Figure 7B:
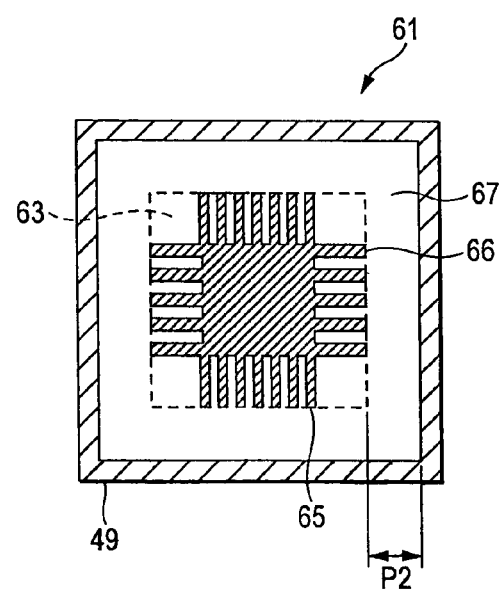

FIGS. 7A and 7B are views for use in describing the variation 2 of the measurement mask pattern of the first embodiment. FIG. 7A shows a first measurement mask pattern 51 as the measurement mask pattern of the flare measuring mask. The first measurement mask pattern 51 includes a first rectangular transparent area 57 formed by a first shielding area 59 and a first measuring portion 53 similar to the first transparent area 57 and inside of the first transparent area 57.

The first measuring portion 53 has a plurality of first stripes 55 of the same figure aligned in parallel at regular intervals and a plurality of third stripes 56 having the different figure from the first stripes. The first stripes 55 and the third stripes 56 are arranged in a double cross, crossing each other at right angles in a central portion, and a central portion of the double cross structure becomes a rectangular shielding portion.

FIG. 7B shows a second measurement mask pattern 61 as the measurement mask pattern of the flare measuring mask. The second measurement mask pattern 61 includes a second rectangular transparent area 67 formed by a second shielding area 69 and a second measuring portion 63 similar to the second transparent area 67 and inside of the second transparent area 67.

The second measuring portion 63 has a plurality of second stripes 65 of the same figure aligned in parallel at regular intervals and a plurality of fourth stripes 66 having the different figure from the second stripes. The second stripes 65 and the fourth stripes 66 are arranged in a double cross, crossing each other at right angles in a central portion, and the central portion of the double cross structure becomes a rectangular shielding portion. The second measuring portion 63 has the same figure and the same size as the first measuring portion 53. Namely, the second stripes 65 have the same figure as the first stripes 55, with the same line width, the same intervals, and the same number of lines, and the fourth stripes 66 have the same figure as the third stripes 56, with the same line width and length, the same intervals, and the same number of lines.

The first shielding area 59 is different from the second shielding area 69 in size and therefore, the first transparent area 57 formed by the first shielding area 59 is also different from the second transparent area 67 formed by the second shielding area 69 in size.

In the variation 1 described referring to FIGS. 6A and 6B, the first stripe 35 has the same figure as the third stripe 36 in the first measuring portion 33, and in the variation 2, however, the first stripe 55 and the third stripe 56 are formed differently in the line width and the intervals in the first measuring portion 53. By forming the orthogonal stripes in a different line width and different intervals, it is possible to measure the influence of the flare upon the two kinds of the mask patterns at the same time.

Variation 3 of the First Embodiment

Figure 11A:
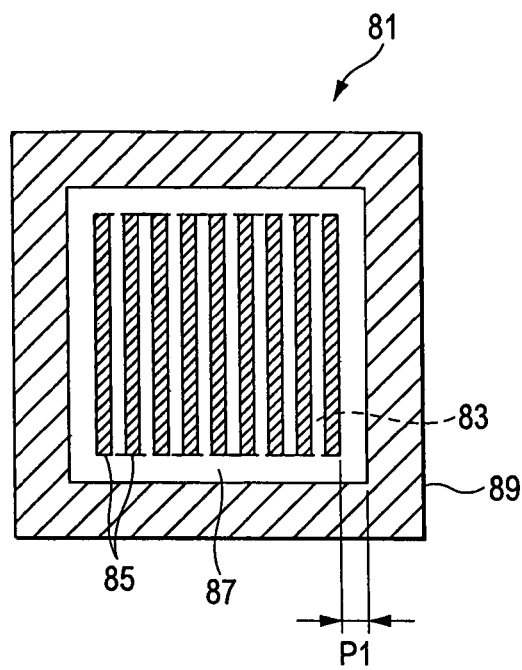
FIG. 11 is a view for use in describing the conventional flare measuring mask.
Figure 11B:
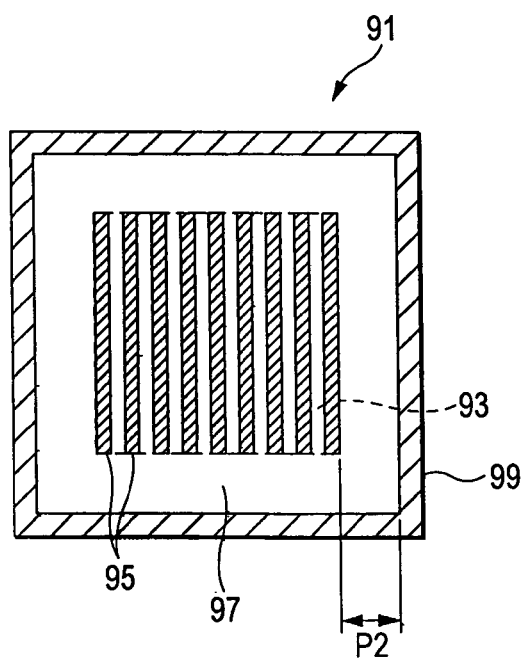
Figure 13A:
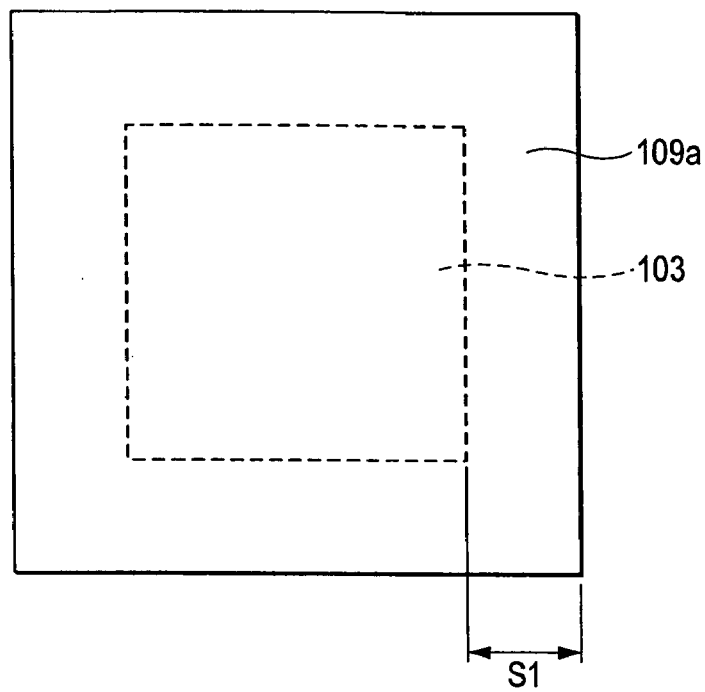
FIG. 13 is a view for use in describing the conventional shielding pattern for use in double exposure.
Figure 13B:
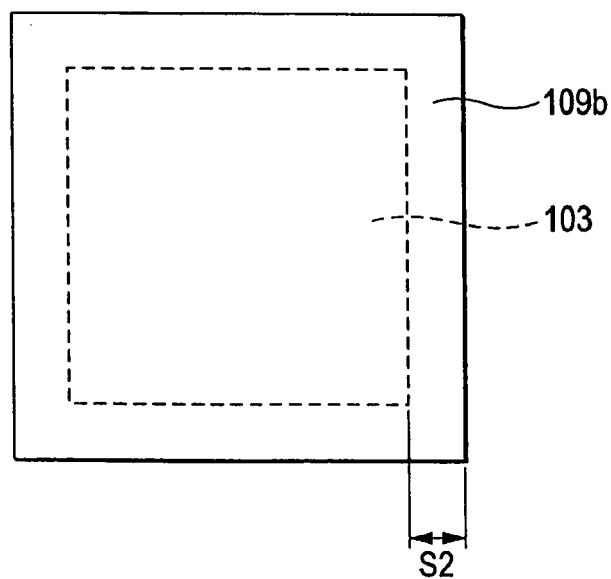

When only the flare in the single direction has to be measured or only the influence upon the single mask shape has to be measured, in the measurement of the influence of the flare, the stripe-shaped measurement mask pattern in the conventional technique may be used in the measuring portion (refer to FIG. 11).

Since the resist pattern is measured in the longitudinal direction, in the variation 3, it is not necessary to use the CD-SEM, but it can be measured by the ordinary optical measuring instrument. Therefore, it is possible to measure the flare more easily for shorter time than in the case of using the CD-SEM.

Second Embodiment

Figure 8A:
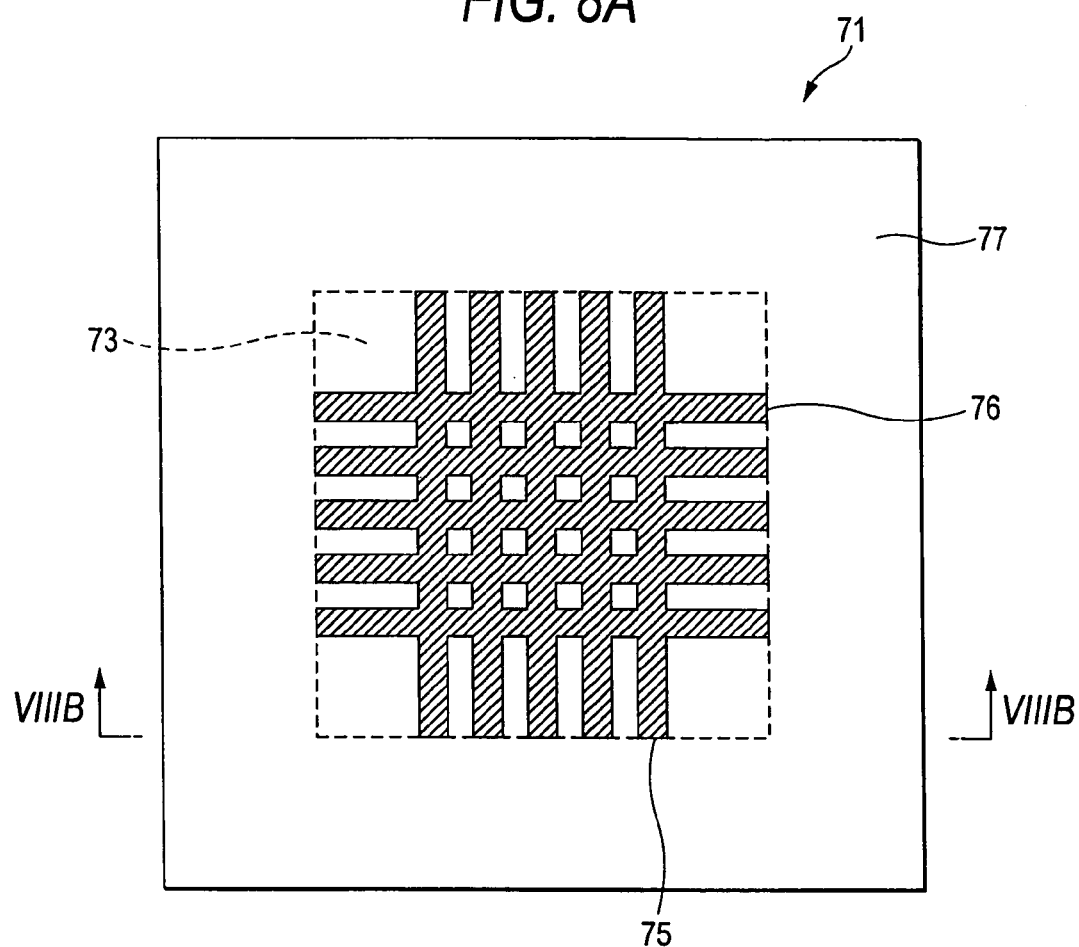
FIG. 8 is a schematic view for use in describing a mask for measuring the flare in double exposure according to a second embodiment.
Figure 8B:
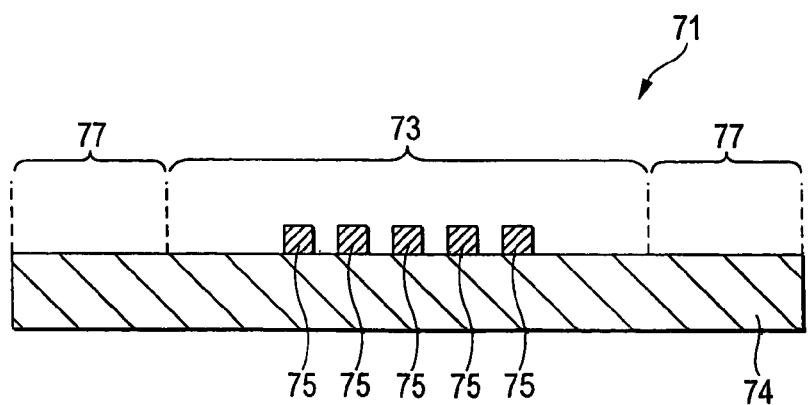

With reference to the drawings, the flare measuring mask and the flare measuring method in the case of double exposure of exposing a mask to light in two steps will be described. FIGS. 8A and 8B are schematic views for use in describing the flare measuring mask of the double exposure.

FIG. 8A shows an example of a first measurement mask pattern 71 as the measurement mask pattern of the flare measuring mask. The first measurement mask pattern 71 has a first measuring portion 73 in a first transparent area 77. The first measuring portion 73 includes a plurality of first stripes 75 of the same figure aligned in parallel at regular intervals and a plurality of third stripes 76 of the same figure aligned in parallel at regular intervals, and the first stripes 75 and the third stripes 76 are arranged in a double cross, crossing with each other at right angles in a central portion.

The second measurement mask pattern in the case of using the double exposure has the same figure and the same size as the first measurement mask pattern 71.

FIG. 8B is a cross sectional view of the flare measuring mask having the first measurement mask pattern 71 taken on the line VIIIB—VIIIB of FIG. 8A. The flare measuring mask is formed by providing an optical shielding material such as chrome on a transparent substrate 74 such as quartz. The first stripes 75 and the third stripes 76 are formed by the optical shielding material. Since the second measurement mask pattern has the same structure as the first measurement mask pattern, the description thereof is omitted. The first measurement mask pattern 71 and the second measurement mask pattern may be provided on the same transparent substrate 74, or the first measurement mask pattern 71 may be provided on the transparent substrate 74 different from that one with the second measurement mask pattern provided thereon.

Figure 10A:
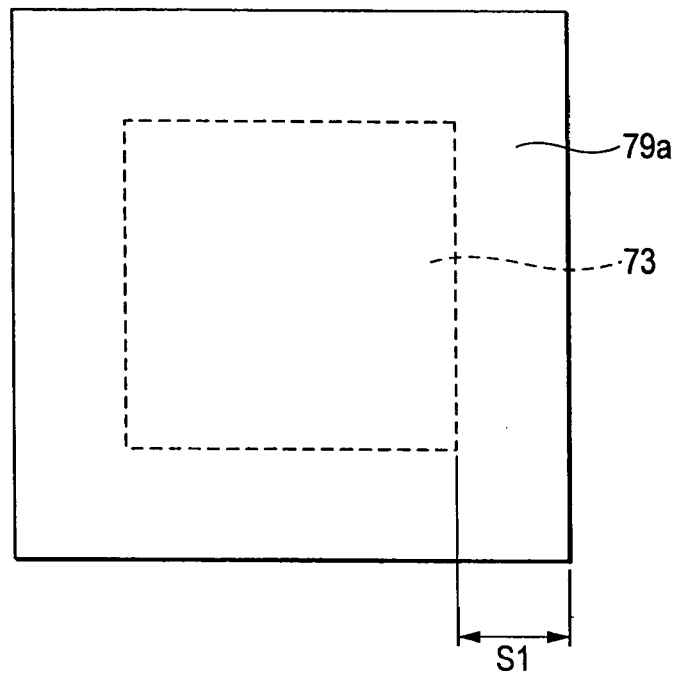
FIG. 10 is a view for use in describing a shielding pattern for use in double exposure.
Figure 10B:
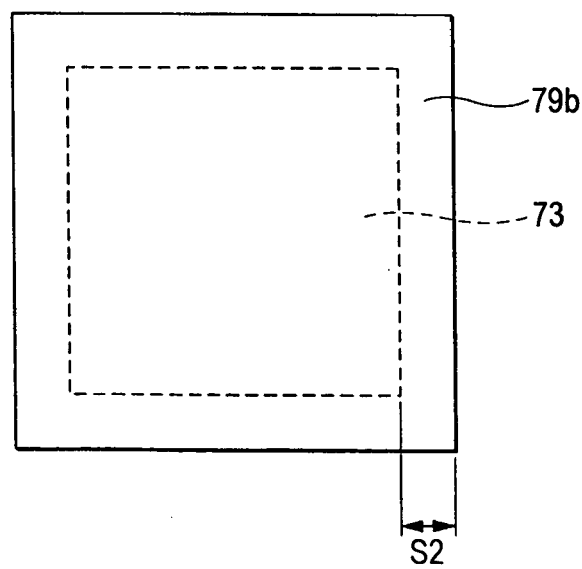

FIGS. 9A and 9B are views for use in describing the flare measuring method using the double exposure. FIGS. 9A and 9B are views each corresponding to the dross section taken on the line VIIIB—VIIIB of FIG. 8A. A wafer 202 with a resist layer 212 formed on the surface thereof by photoresist is fixed to a semiconductor aligner (not illustrated) that is a target of the flare measurement. Two of the first measurement mask patterns 71 are prepared, and then the resist layer 212 on the wafer 202 is exposed by using these two measurement mask patterns for double exposure. In the figure, the exposure light is indicated by $L_E$. Owing to the exposure, the first measurement mask pattern 71 is projected on the resist layer 202 in a reduced size. This time, light exposure is performed by using a shielding pattern 79 capable of covering the measurement mask pattern 71 for double exposure, similar to the first and the second measurement mask patterns. As the shielding pattern 79, when shielding patterns of different size (the first shielding pattern 79a or the second shielding pattern 79b of FIG. 10) are used for the light exposure, it substantially turns into the same results as the light exposure by using the patterns of the different opening widths P1 and P2 in the first embodiment described with reference to FIGS. 1A and 1B, thereby obtaining the influence of the flare (the flare is indicated as LF in the FIG. 9). Here, FIGS. 10A and 10B are views for use in describing the shielding patterns.

After the patterning process, the resist length is measured as for the first resist pattern obtained by the first measurement mask pattern 71 and the first shielding pattern 79a and the first resist pattern obtained by the first measurement mask pattern 71 and the second shielding pattern 79b. The process of measuring the resist length is the same as the first embodiment, and therefore, the description thereof is omitted.

The optical measuring instrument is used to measure the length L1 of the first resist stripe (hereinafter, also referred to as the first resist stripe length) in the longitudinal direction, the length L3 of the third resist stripe (hereinafter, also referred to as the third resist stripe length) in the longitudinal direction, in the first resist pattern, and the length L2 of the first resist stripe (hereinafter, also referred to as the second resist stripe length) in the longitudinal direction and the length L4 of the fourth resist stripe (hereinafter, also referred to as the fourth resist stripe length) in the longitudinal direction, in the second resist pattern.

Continuously, the presence of the flare is checked in the flare measuring process. When there is no first flare, the first resist stripe length L1 and the second resist stripe length L2 having the same figure are equal to each other. When there is the first flare, however, in the case of setting the second shielding width S2 defined by the space between the second shielding pattern 79b and the first measuring portion 73 smaller than the first shielding width S1 defined by the space between the first shielding pattern 79a and the first measuring portion 73, the influence of the first flare becomes greater in the case of using the second shielding pattern 79b and the second resist stripe length L2 becomes shorter than the first resist stripe length L1.

Accordingly, when the first resist pattern length L1 is equal to the second resist pattern length L2, it is found that there is no first flare, and when the second resist pattern length L2 is shorter than the first resist pattern length L1, it is found that there is the first flare. Further, when there is a difference between the first resist pattern length L1 and the second resist pattern length L2, it is found that the first flare is greater according as the difference is larger and that the first flare is smaller according as the difference is smaller.

Although the description has been made in the case of using two kinds of shielding patterns, use of the shielding patterns having three kinds or more of different shielding widths could find the presence of the flare and its degree more accurately.

As for the direction orthogonal to the first resist pattern and the second resist pattern, similarly, it is possible to check the presence of the second flare in the direction orthogonal to the first flare and its degree according to the first shielding width S1, the second shielding width S2, the third resist pattern length L3, and the fourth resist pattern length L4.

Each size of the first and the second shielding patterns 79a and 79b has to be large enough to cover the first and the second measuring portions respectively and the first shielding width S1 and the second shielding width S2 have to be set within the range of zero to several hundred μm.

According to the second embodiment, by performing the exposure twice, it is possible to estimate the influence of the flare, especially, incident from the outside of the measurement mask pattern. In this case, there have to be prepared one kind of the measurement mask pattern and the shielding patterns of different size. Further, since the resist pattern is measured in the longitudinal direction, it is not necessary to use the CD-SEM, but the ordinary optical measuring instrument can measure the above. Therefore, it is possible to measure the flare more easily for a shorter time than in the case of using the CD-SEM.

Since the distal end portion of the stripe-shaped pattern is much more affected by the flare than the central portion thereof, a change in the length becomes greater than a change in the width. Therefore, it is possible to measure the flare at higher sensitivity. Further, it has an advantage that the flare can be measured in the two orthogonal directions at the same time.

Variation of the Second Embodiment

When performing the double exposure, as the first and the second measurement mask pattern, the first measuring portion 73 may be replaced with the first measuring portion 33 of the variation 1 described with reference to FIG. 6, the first measuring portion 53 of the variation 2 described with reference to FIG. 7, or the first measuring portion 83 of the variation 3 described with reference to FIG. 11. By replacing the first measuring portion, it is possible to estimate the influence of the flare from the outside, according to the double exposure, with each effect of the variations 1 to 3.

What is claimed is:
1. A flare measuring method for checking presence of flare in a semiconductor aligner, comprising:
preparing a first measurement mask pattern including a first rectangular transparent area formed by a first shielding area and a first measuring portion similar to the first transparent area, provided within the first transparent area and having a plurality of first stripe-shaped shielding portions of the same figure aligned in parallel at regular intervals;

preparing a second measurement mask pattern including a second transparent area, similar to the first transparent area and wider than the first transparent area, formed by a second shielding area, and a second measuring unit, provided within the second transparent area, having second stripe-shaped shielding portions identical to the first strip-shaped shielding portions;

a patterning process of projecting the first and the second measurement mask patterns on a resist layer in a reduced size through light exposure and then patterning the exposed resist layer;

a resist length measuring process of optically measuring a first resist pattern length in a direction orthogonal to an alignment direction of a first resist pattern, corresponding to the first stripe-shaped shielding portions and a second resist pattern length in a direction orthogonal to an alignment direction of a second resist pattern, corresponding to the second stripe-shaped shielding portions, obtained in the patterning process; and a flare measuring process of checking the presence of a first flare according to a first opening width P1 that is a space between the first shielding area and the first measuring portion, a second opening width P2 that is a space between the second shielding area and the second measuring portion, the first resist pattern length L1, and the second resist pattern length L2.

2. The flare measuring method according to claim 1, wherein the first measuring portion includes a double cross shielding portions consisting of a plurality of the first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles in a central portion;

the second measuring portion includes the second stripe-shaped shielding portions identical to the first stripe-shaped shielding portions of the first measuring portion and fourth stripe-shaped shielding portions identical to the third stripe-shaped shielding portions of the first measuring portion, crossing with the second stripe-shaped shielding portions at right angles in a central portion;

the resist length measuring process further includes a process of optically measuring a third resist pattern length of a third resist pattern in a longitudinal direction, corresponding to the third stripe-shaped shielding portions and a fourth resist pattern length of a fourth resist pattern in a longitudinal direction, corresponding to the fourth strip-shaped shielding portions, obtained in the patterning process; and the flare measuring process further includes a process of checking the presence of a second flare in a direction different from the first flare according to the first opening width P1, the second opening width P2, the third resist pattern length L3, and the fourth resist pattern length L4.

3. The flare measuring method according to claim 2, wherein the first stripe-shaped shielding portions are different from the third stripe-shaped shielding portions in line width and line intervals, the first stripe-shaped shielding portions are identical to the second stripe-shaped shielding portions in line width and line intervals, and the third stripe-shaped shielding portions are identical to the fourth stripe-shaped shielding portions in line width and line intervals.

4. A flare measuring method for checking presence of flare in a semiconductor aligner, comprising:

preparing a first measurement mask pattern including a first measuring portion having a plurality of stripe-shaped shielding portions of the same figure aligned in parallel at regular intervals, within a first transparent area;

preparing a second measurement mask pattern including a second measuring portion identical to the first measuring portion, within a second transparent area;

after projecting the first and the second measuring mask patterns on a resist layer in a reduced size through light exposure, preparing a first and a second shielding patterns different from each other in area, similar to the first and the second measurement mask patterns with the same or larger area than the first and the second measurement mask patterns;

a patterning process of covering the first measurement mask pattern with the first shielding pattern and covering the second measurement mask pattern with the second shielding pattern, projecting the above on a resist layer in a reduced size through light exposure, and then patterning the exposed resist layer;

a resist length measuring process of optically measuring a first resist pattern length in a direction orthogonal to an alignment direction of a first resist pattern, corresponding to the first stripe-shaped shielding portions and a second resist pattern length in a direction orthogonal to an alignment direction of a second resist pattern, corresponding to the second stripe-shaped shielding portions, obtained in the patterning process; and a flare measuring process of measuring the presence of a first flare according to a first shielding width S1 that is a space between the first shielding pattern and the first measuring portion, a second shielding width S2 that is a space between the second shielding pattern and the second measuring portion, the first resist pattern-length L1, and the second resist pattern length L2.

5. The flare measuring method according to claim 4, wherein the first measuring portion includes a double cross shielding portions consisting of a plurality of the first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles in a central portion;

the second measuring portion includes the second stripe-shaped shielding portions identical to the first stripe-shaped shielding portions of the first measuring portion and fourth stripe-shaped shielding portions identical to the third stripe-shaped shielding portions of the first measuring portion, crossing with the second stripe-shaped shielding portions at right angles in a central portion;

the resist length measuring process further includes a process of optically measuring a third resist pattern length of a third resist pattern in a longitudinal direction, corresponding to the third stripe-shaped shielding portions and a fourth resist pattern length of a fourth resist pattern in a longitudinal direction, corresponding to the fourth strip-shaped shielding portions, obtained in the patterning process; and the flare measuring process further includes a process of checking the presence of a second flare in a direction different from the first flare according to the first shielding width S1, the second shielding width S2, the third resist pattern length L3, and the fourth resist pattern length L4.

6. The flare measuring method according to claim 5, wherein the first stripe-shaped shielding portions are different from the third stripe-shaped shielding portions in line width and line intervals, the first stripe-shaped shielding portions are identical to the second stripe-shaped shielding portions in line width and line intervals, and the third stripe-shaped shielding portions are identical to the fourth stripe-shaped shielding portions in line width and line intervals.

7. A flare measuring mask comprising a double cross shielding portions consisting of a plurality of first stripe-shaped shielding portions of the same figure aligned in parallel at regular intervals and a plurality of third stripe-shaped shielding portions of the same figure aligned in parallel at regular intervals, crossing with the first stripe-shaped shielding portions at right angles in a central portion, provided within a transparent area.

8. The flare measuring mask according to claim 7, wherein the first stripe-shaped shielding portions are deferent from the third stripe-shaped shielding portions in line width and line intervals.

9. The flare measuring mask according to claim 7, wherein the transparent area is formed by a shielding area.

10. The flare measuring mask according to claim 8, wherein the transparent area is formed by a shielding area.

11. The flare measuring mask according to claim 7, wherein a shielding mask is formed in a central lattice area of the double cross shielding portions.

12. The flare measuring mask according to claim 8, wherein a shielding mask is formed in a central lattice area of the double cross shielding portions.

13. The flare measuring mask according to claim 9, wherein a shielding mask is formed in a central lattice area of the double cross shielding portions.

14. The flare measuring mask according to claim 10, wherein a shielding mask is formed in a central lattice area of the double cross shielding portions.

* * * * *